(12) United States Patent
Seo

(10) Patent No.: US 7,015,114 B2
(45) Date of Patent: Mar. 21, 2006

(54) TRENCH IN SEMICONDUCTOR DEVICE AND FORMATION METHOD THEREOF

(75) Inventor: Young-Hun Seo, Bucheon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/728,699

(22) Filed: Dec. 5, 2003

(65) Prior Publication Data

US 2004/0121532 A1    Jun. 24, 2004

(30) Foreign Application Priority Data

Dec. 20, 2002   (KR)   .................. 10-2002-0081996
Dec. 20, 2002   (KR)   .................. 10-2002-0081997

(51) Int. Cl.
    *H01L 21/30* (2006.01)
(52) U.S. Cl. ..................................... 438/430; 257/510
(58) Field of Classification Search ................ 438/404, 438/405, 410, 430, 432, 439; 257/510
    See application file for complete search history.

(56) References Cited

U.S. PATENT DOCUMENTS

| 5,521,422 | A | 5/1996 | Mandelman et al. |
| 5,910,018 | A * | 6/1999 | Jang .......................... 438/425 |
| 5,956,598 | A | 9/1999 | Huang et al. |
| 5,989,977 | A | 11/1999 | Wu |
| 6,001,706 | A | 12/1999 | Tan et al. |
| 6,184,105 | B1 * | 2/2001 | Liu et al. ..................... 438/424 |
| 6,399,462 | B1 | 6/2002 | Ramkumar et al. |
| 6,495,430 | B1 | 12/2002 | Tsai et al. |
| 6,566,207 | B1 * | 5/2003 | Park ........................... 438/296 |
| 6,667,224 | B1 | 12/2003 | Watt et al. |
| 6,794,269 | B1 | 9/2004 | Gopalan et al. |

* cited by examiner

*Primary Examiner*—David Vu
(74) *Attorney, Agent, or Firm*—Andrew D. Fortney

(57) ABSTRACT

A method of forming a trench in a semiconductor device includes forming a sacrificial layer on a silicon wafer and selectively etching the sacrificial layer to form a LOCOS opening having a predetermined width. Thermal oxidation is performed on a portion of the silicon wafer exposed through the LOCOS opening to form a LOCOS oxide layer. Also, etching is performed on the LOCOS oxide layer and the silicon wafer to a desired depth to form a trench. During this process, etching is performed such that the LOCOS oxide layer is left remaining on the silicon wafer at an area corresponding to edges of the trench. An insulation layer is deposited such that the trench is filled with a material of the insulation layer. The present invention also provides a trench in a semiconductor device used as a device isolation region formed in a silicon wafer. Upper corner areas of the silicon wafer adjacent to the trench are rounded, and a LOCOS oxide layer is formed on the corner areas.

15 Claims, 5 Drawing Sheets

TRENCH IN SEMICONDUCTOR DEVICE AND FORMATION METHOD THEREOF

BACKGROUND OF THE INVENTION (a) Field of the Invention

The present invention relates to a semiconductor device. More particularly, the present invention relates to a trench in a semiconductor device and a formation method thereof.

(b) Description of the Related Art

A LOCOS (local oxidation of silicon) isolation structure, in which a semiconductor substrate is thermally oxidized using a nitride layer as a mask, is widely used as an isolation structure for conventional semiconductor devices. However, the formation of a bird's beak configuration and an increase in a field region result from LOCOS isolation. As a result, there are limitations to how small the device can be made when using the LOCOS isolation structure.

In an effort to overcome these problems, STI (shallow trench isolation) is used in place of LOCOS isolation. In STI, a trench is formed in a semiconductor substrate, and an insulation material is filled in the trench. Since the formation is limited to the size of the trench, which has as its object size a field region size, this configuration works favorably toward making the semiconductor device small.

U.S. Pat. Nos. 5,521,422, 5,956,598, 5,989,977, 6,001,706, and 6,495,430 are conventional techniques related to STI.

A conventional method for forming a trench in a semiconductor device will be described with reference to FIGS. 1a and 1b.

With reference first to FIG. 1a, a pad oxide layer 2 then a silicon nitride layer 3 are deposited on a semiconductor substrate 1. Next, a photoresist layer is deposited on the silicon nitride layer 3, then the photoresist layer is exposed to remove a portion thereof corresponding to where a trench is to be formed to thereby realize a photoresist layer pattern 4.

Subsequently, with reference to FIG. 1b, using the photoresist layer pattern 4 as a mask, the exposed portion of the silicon nitride layer 3 then the pad oxide layer 2 and a predetermined section of the semiconductor substrate 1 (i.e., a section corresponding to a predetermined depth) under the removed section of the pad oxide layer 2 are dry-etched. A trench 100 is therefore formed in the semiconductor substrate 1. The photoresist layer pattern 4 is removed after the formation of the trench 100, then a cleaning process is performed.

Next, a liner oxide layer 5 is formed over all exposed elements of the silicon nitride layer 3, the pad oxide layer 2, and inner walls of the trench 100, after which a trench oxide layer 6 is thickly deposited on the liner oxide layer 5 at least until the trench 100 is completely filled.

The liner oxide layer 5 minimizes the stress transferred to the trench region during deposition of the trench oxide layer 6. The liner oxide layer 5 also prevents the uneven formation of the trench oxide layer 6 caused by differences in deposition rates on the semiconductor substrate 1 and the silicon nitride layer 3, which results from the difference in the materials of the semiconductor substrate 1 and the silicon nitride layer 3. In addition, with the formation of the liner oxide layer 5, upper corner areas of the semiconductor substrate 1 adjacent to the trench 100 are rounded (i.e., prevented from being sharply pointed) following a subsequent trench isolation process.

Next, chemical-mechanical polishing is performed on the trench oxide layer 6 and the liner oxide layer 5 until the silicon nitride layer 3 is exposed, that is, until the trench oxide layer 6 and the liner oxide layer 5 are flattened and flush with the silicon nitride layer 3. This completes the trench isolation process.

However, in the conventional STI as described above, it is difficult to realize the rounding of the upper corners of the semiconductor substrate that are adjacent to the trench through only the formation of the liner oxide layer. This becomes increasingly difficult as the degree of integration of the device is raised.

Accordingly, upper areas of the semiconductor substrate adjacent to the trench are formed with sharp corners. If an electric charge is concentrated in these corner areas, a dielectric breakdown voltage is reduced. There is therefore a need to realize a method for rounding the upper corner areas of the semiconductor substrate adjacent to the trench.

SUMMARY OF THE INVENTION

In one exemplary embodiment of the present invention, there is provided a trench in a semiconductor device and a formation method thereof in which upper corner areas of a semiconductor device adjacent to the trench are formed in a rounded configuration. The present invention also provides an STI configuration that is advantageous in the formation of a small device.

In an exemplary embodiment of the present invention, a method of forming a trench in a semiconductor device is provided. The method includes forming a sacrificial layer on a silicon wafer and selectively etching the sacrificial layer to form a LOCOS opening having a predetermined width; performing thermal oxidation on a portion of the silicon wafer exposed through the LOCOS opening to form a LOCOS oxide layer; etching the LOCOS oxide layer and the silicon wafer to a desired depth to form a trench, the etching being performed such that the LOCOS oxide layer is left remaining on an area of the silicon wafer corresponding to edges of the trench; and forming an insulation layer such that the trench is filled with a material of the insulation layer.

During formation of the LOCOS opening, a predetermined width of the sacrificial layer located at edges of a region where the trench is to be formed is etched, or the sacrificial layer is etched to a width greater by a predetermined amount than a region to be occupied by a trench.

In etching a predetermined width of the sacrificial layer located at edges of a region where the trench is to be formed, the sacrificial layer is etched to a width of 50–500 Å. Further, in etching the sacrificial layer to a width greater by a predetermined amount than a region to be occupied by the trench, the sacrificial layer is etched to a width that is at most 400 Å greater than the trench.

During formation of the trench, a photoresist layer is deposited on the LOCOS oxide layer and the sacrificial layer, then the photoresist layer is exposed and developed to form a photoresist layer pattern that exposes an area of the LOCOS oxide layer where the trench is to be formed, after which the photoresist layer pattern is used as a mask to etch the exposed area of the LOCOS oxide layer and the silicon wafer to a desired depth.

The photoresist layer pattern is formed so that at most 200 Å of a width of the LOCOS oxide layer positioned at edges of the trench is covered such that at most 400 Å of an entire cross-sectional width is covered, and the remainder of the LOCOS layer is exposed.

The method further includes forming a liner oxide layer prior to forming the insulation layer, the liner oxide layer covering inner walls of the trench and the remaining region of the LOCOS oxide layer. The liner oxide layer is formed to a thickness of 100–500 Å.

The method further includes removing the remaining region of the LOCOS oxide layer and forming a liner oxide layer prior to forming the insulation layer.

The method further includes performing chemical-mechanical polishing on the insulation layer following the formation of the same until the sacrificial layer is exposed.

The method further includes forming a pad oxide layer on the silicon wafer prior to forming the sacrificial layer, and forming the sacrificial layer on the pad oxide layer. The sacrificial layer is made of a material that is polished more slowly than the insulation layer that fills the trench. A nitride layer may be used as the sacrificial layer, in which case the nitride layer is formed to a thickness of 1500–3000 Å.

In another exemplary embodiment of the present invention, there is provided a trench in a semiconductor device used as a device isolation region formed in a silicon wafer. Upper corner areas of the silicon wafer adjacent to the trench are rounded, and a LOCOS oxide layer is formed on the corner areas.

A liner oxide layer is formed on inner walls of the trench and on the LOCOS oxide layer. The liner oxide layer is formed to a thickness of 100–500 Å.

The LOCOS oxide layer is formed to a thickness of at most 200 Å.

Further, a liner oxide layer is formed along inner walls of the trench and on the LOCOS oxide layer, to a thickness of 100–500 Å.

BRIEF DESCRIPTION OF THE DRAWINGS

The accompanying drawings, which together with the specification, illustrate exemplary embodiments of the present invention, and, together with the description, serve to explain the principles of the present invention.

DETAILED DESCRIPTION

Exemplary embodiments of the present invention will now be described in detail with reference to the accompanying drawings.

Figure 1A:
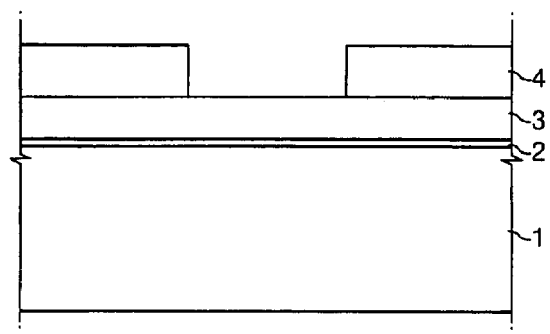
FIGS. 1a and 1b are sectional views used to describe a conventional method for forming a trench in a semiconductor device.
Figure 1B:
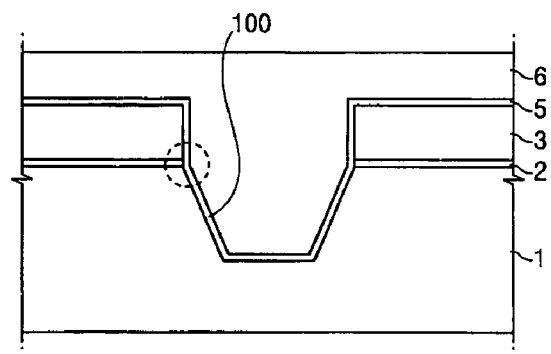
Figure 2A:
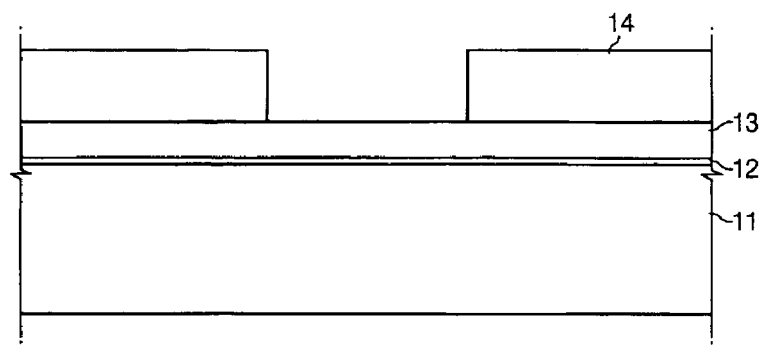
FIGS. 2a through 2e are sectional views used to describe a method for forming a trench in a semiconductor device according to an exemplary embodiment of the present invention.
Figure 2B:
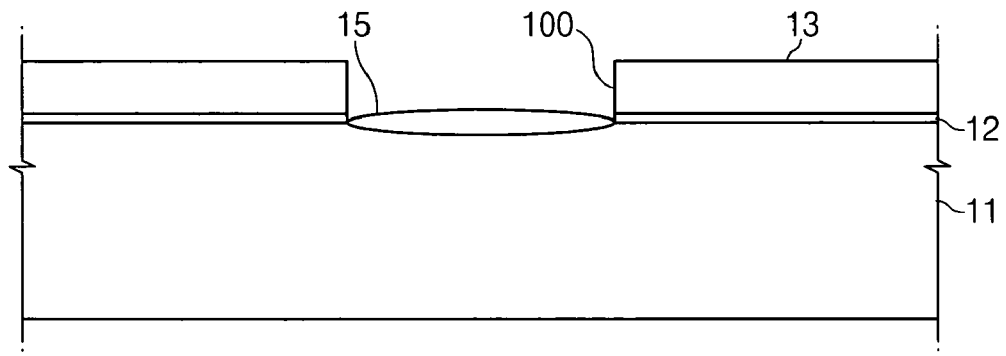
Figure 2C:
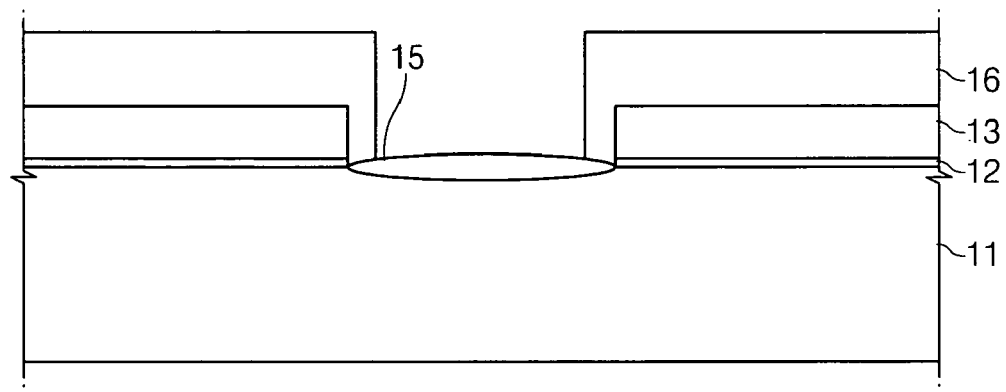
Figure 2D:
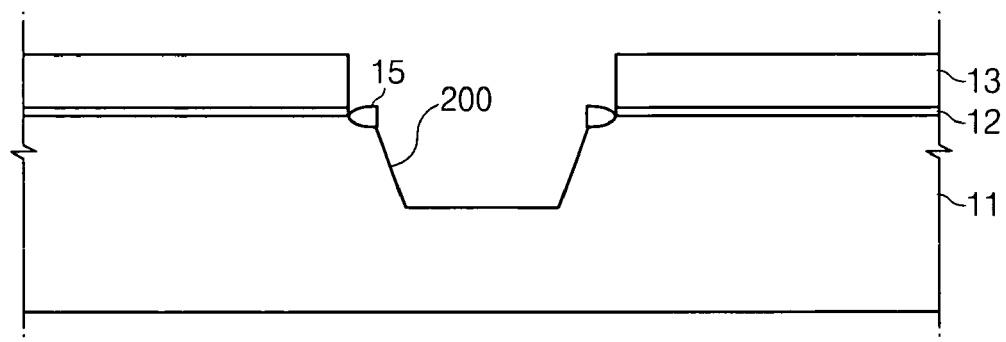
Figure 2E:
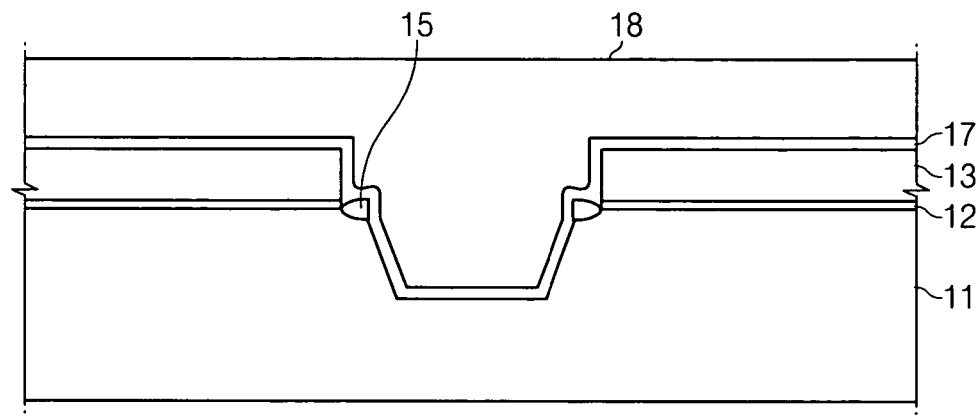

Referring to FIG. 2e, a trench in a semiconductor device according to an exemplary embodiment of the present invention is formed as a device separation region in a silicon wafer 11 and is filled with an insulation material, preferably an oxide layer 18 (i.e., a trench oxide layer).

A LOCOS (local oxidation of silicon) oxide layer 15 is formed along both edges of the trench such that upper corners of the silicon wafer 11 adjacent to the trench are rounded. The LOCOS oxide layer 15 is formed to a width of 200 Å or less. Since the upper corners of the silicon wafer 11 are rounded even with the formation of a minimal amount of the LOCOS oxide layer 15, it is not possible to establish a lower limit value of the width of the LOCOS oxide layer 15.

A liner oxide layer 17 is formed along inner walls of the trench and on the LOCOS oxide layer 15. The liner oxide layer 17 is formed to a thickness of 100–500 Å.

A method for forming a trench in a semiconductor device according to an exemplary embodiment of the present invention will now be described with reference to FIGS. 2a through 2e.

With reference first to FIG. 2a, a pad oxide layer 12 is thinly deposited on a semiconductor substrate 11. Next, a nitride layer 13 is deposited on the pad oxide layer 12, then a photoresist layer is deposited on the nitride layer 13. The photoresist layer is exposed to remove a portion thereof corresponding to where a trench is to be formed to thereby realize a first photoresist layer pattern 14. The first photoresist layer pattern 14 exposes a width of the nitride layer 13 that is slightly greater than a width of a region where the trench is to be formed.

When forming the first photoresist layer pattern 14, an area that is larger than an area of where the trench is to be formed corresponds to a size of a LOCOS oxide layer to be formed in a subsequent process. This removed area of the photoresist layer to realize the first photoresist layer pattern 14 may be varied depending on the desired degree of roundness of upper corners of the silicon wafer 11. Preferably, an area that is larger than the area where the trench is to be formed is 200 Å or less on each side, and 400 Å or less of an overall cross-sectional width.

The pad oxide layer 12 is selectively deposited to minimize stress of the nitride layer 13 from being transmitted to the silicon wafer 11. Preferably, the pad oxide layer 12 is deposited thinly at a thickness of 100–300 Å, more preferably 200 Å.

The nitride layer 13 has a polish speed that is less than that of a material of an oxide layer used to fill the trench, to thereby act as a polish stop layer during chemical-mechanical polishing of the trench oxide layer. The nitride layer 13 is preferably deposited to a thickness of 1500–3000 Å. As an example, the nitride layer 13 may be formed to a thickness of 2000 Å.

Next, with reference to FIG. 2b, the first photoresist layer pattern 14 is used as a mask to etch the exposed area of the nitride layer 13 and the pad oxide layer 12 thereunder to thereby form a LOCOS opening 100 that exposes the silicon wafer 11. The first photoresist layer pattern 14 is removed following this procedure, then a cleaning process is performed.

Next, thermal oxidation of the silicon wafer 11 is performed through the LOCOS opening 100 to form a LOCOS oxide layer 15 in this area of the exposed silicon wafer 11. The LOCOS oxide layer 15 is formed into the shape of an ellipse as a result of thermal oxidation characteristics of the silicon wafer 11. Further, by varying a thickness of the LOCOS oxide layer 15, the degree of roundness of an upper portion of the trench, which will be formed in a subsequent process, may be controlled.

Referring now to FIG. 2c, a photoresist layer is deposited on the LOCOS oxide layer 15 and the nitride layer 13, then the photoresist layer is exposed and developed to form a second photoresist layer pattern 16 with an opening that exposes an area corresponding to where the trench is to be formed. The opening of the second photoresist layer pattern 16 is typically positioned above an approximately center position of the LOCOS oxide layer 15, and an area of the second photoresist layer pattern 16 defining its opening covers 200 Å or less of the LOCOS oxide layer 15. That is, if a cross section of the structure as shown in FIG. 2c is described, the photoresist layer pattern 16 is formed such that 200 Å or less of opposing sides of the LOCOS oxide layer 15 is covered by the photoresist layer pattern 16, and the remainder of the LOCOS oxide layer 15 is exposed.

Subsequently, with reference to FIG. 2d, using the second photoresist layer pattern 16 as a mask, an exposed portion of the LOCOS oxide layer 15 is etched. The silicon wafer 11 is then etched in the same area to a predetermined depth. This results in the formation of a trench 200 such that a portion of the LOCOS oxide layer 15 is left remaining on portions of the silicon wafer 11 at edges of the trench 200. This remaining portion of the LOCOS oxide layer 15 acts to round the upper corners of the silicon wafer 11 adjacent to the trench 200.

Next, with reference to FIG. 2e, a trench oxide layer 18 is thickly deposited on all exposed elements of inner walls of the trench 200, the LOCOS oxide layer 15, and the nitride layer 13 until the trench 200 is sufficiently filled. Prior to depositing the trench oxide layer 18, a liner oxide layer 17 may be formed to a thickness of 100–500 Å over all exposed elements of the inner walls of the trench 200, the LOCOS oxide layer 15, and the nitride layer 13. The liner oxide layer 17 improves deposition characteristics of the trench oxide layer 18. Further, prior to depositing the trench oxide layer 18, the liner oxide layer 17 may be formed to a thickness of 100–500 Å after removing the remaining portion of the LOCOS oxide layer 15.

Figure 3A:
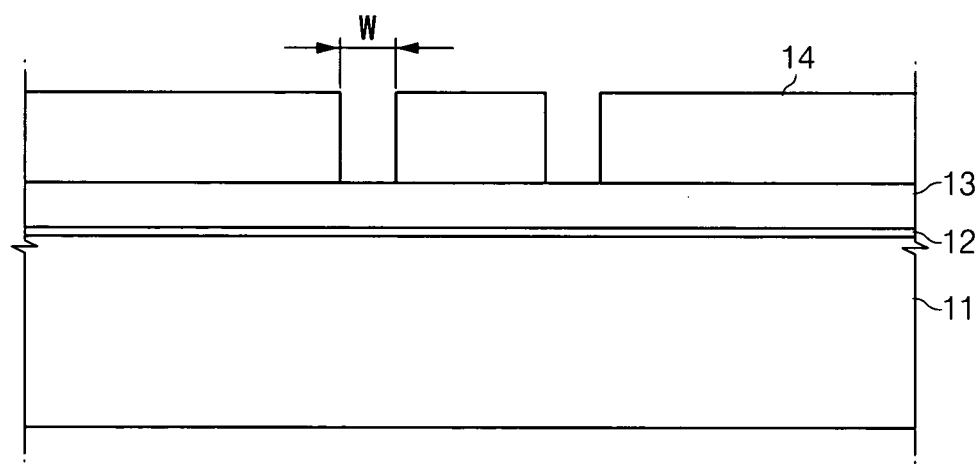
FIGS. 3a through 3e are sectional views used to describe a method for forming a trench in a semiconductor device according to another exemplary embodiment of the present invention.
Figure 3B:
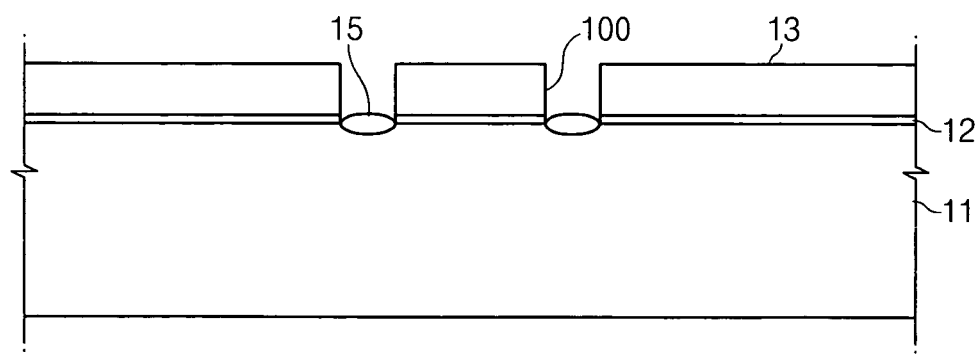
Figure 3C:
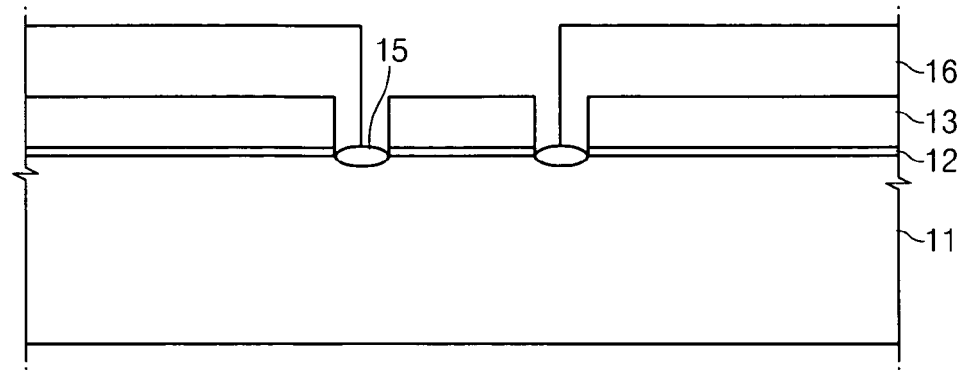
Figure 3D:
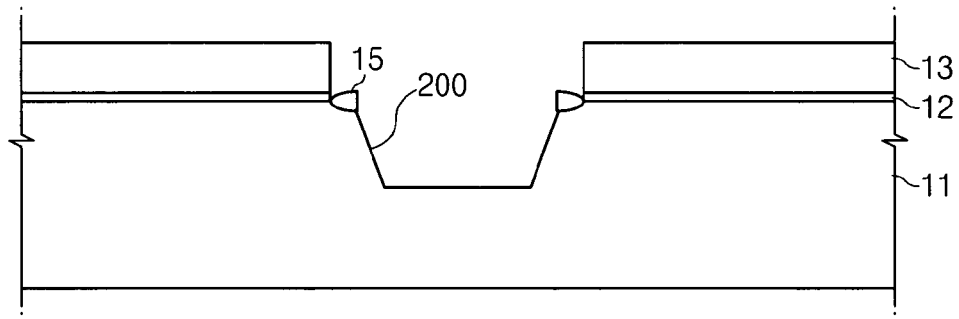
Figure 3E:
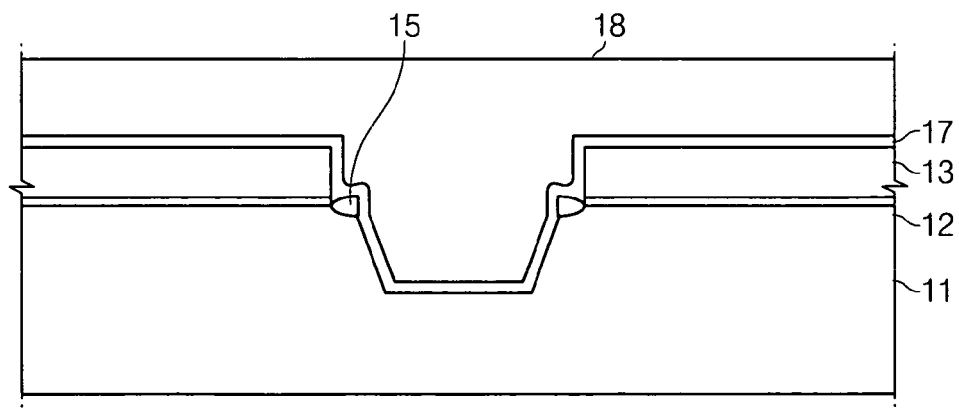
Figure 3F:
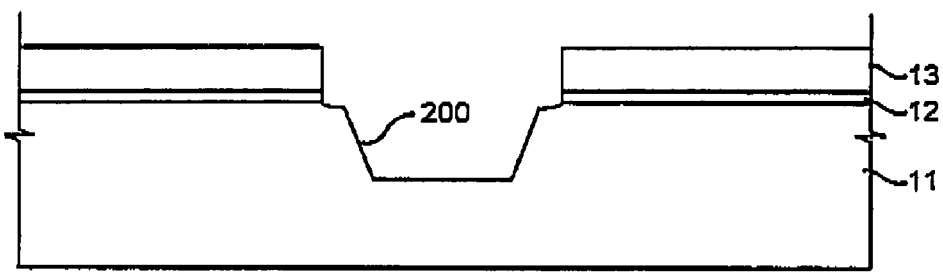
Figure 3G:
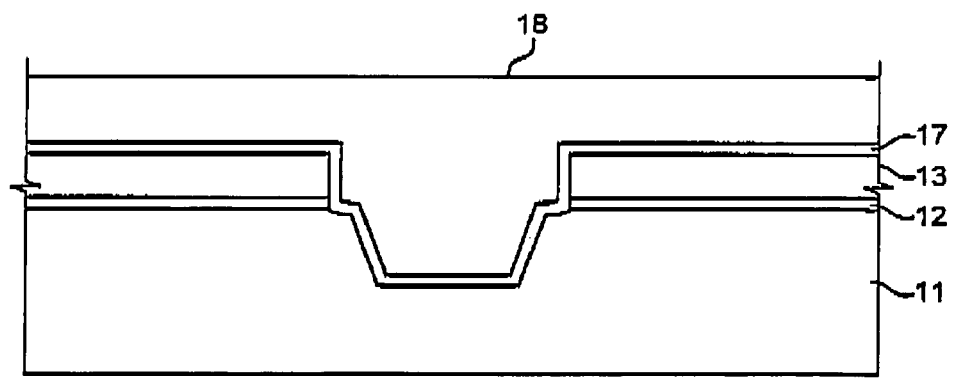

Alternatively, with reference to FIGS. 3d and 3f, the exposed, remaining portions of the LOCOS oxide layers 15 (FIG. 3d) may be removed (FIG. 3f). Next, with reference to FIG. 3g, a liner oxide layer 17 may be formed and a trench oxide layer 18 thichly deposited on all exposed elements of inner walls of the trench 200 and the nitride layer 13 until the trench 200 is sufficiently filled.

Following the above processes, chemical-mechanical polishing is performed on the trench oxide layer 18 to flatten the same, then the nitride layer 13 and the pad oxide layer 12 are removed by a wet etching process. This completes the shallow trench isolation process.

FIGS. 3a through 3e are sectional views used to describe a method for forming a trench in a semiconductor device according to another exemplary embodiment of the present invention.

Referring first to FIG. 3a, a pad oxide layer 12 is thinly formed on a silicon wafer 11, then a nitride layer 13 is deposited on the pad oxide layer 12. Next, a photoresist layer is deposited on the nitride layer 13, then the photoresist layer is exposed such that areas of a predetermined width of the photoresist layer positioned at edges of a region where a trench is to be formed are removed to thereby form a first photoresist layer pattern 14.

During formation of the photoresist layer pattern 14, a width W of the photoresist layer positioned at edges of the region where a trench is to be formed corresponds to a size of a LOCOS oxide layer to be formed in a subsequent process. The width W may be varied depending on the desired degree of rounding of upper corners of the silicon wafer 11 adjacent to a trench. Preferably, the width W is 50–500 Å.

Referring to FIG. 3b, using the first photoresist layer pattern 14 as a mask, exposed areas of the nitride layer 13 then the pad oxide layer 12 thereunder are etched to form LOCOS openings 100. The first photoresist layer pattern 14 is removed following the formation of the LOCOS openings 100, then a cleaning process is performed.

Subsequently, thermal oxidation is performed on areas of the silicon wafer 11 exposed through the LOCOS holes 100 such that LOCOS oxide layers 15 are formed therein. The LOCOS oxide layers 15 are formed into the shape of an ellipse as a result of thermal oxidation characteristics of the silicon wafer 11. Further, by varying a thickness of the LOCOS oxide layers 15, the degree of roundness of upper corners of a trench to be formed in a subsequent process may be controlled.

Next, referring to FIG. 3c, a photoresist layer is deposited on the LOCOS oxide layers 15 and the nitride layer 13, then the photoresist layer is exposed and developed to form a second photoresist layer pattern 16 with an opening that exposes an area corresponding to where a trench is to be formed. The opening of the second photoresist layer pattern 16 is typically positioned above approximately a center position of the LOCOS oxide layer 15. Also, an area of the second photoresist layer pattern 16 defining its opening covers 200 Å or less of the LOCOS oxide layer 15, and the opening exposes the remainder of the LOCOS oxide layer 15.

Subsequently, with reference to FIG. 3d, using the second photoresist layer pattern 16 as a mask, exposed portions of the LOCOS oxide layers 15, the nitride layer 13, and the pad oxide layer 12 are etched. The silicon wafer 11 is then etched in the same area to a predetermined depth. This results in the formation of a trench 200 such that a portion of the LOCOS oxide layer 15 is left remaining on portions of the silicon wafer 11 at edges of the trench 200. This remaining portion of the LOCOS oxide layer 15 acts to round the upper corners of the silicon wafer 11 adjacent to the trench 200.

Next, with reference to FIG. 3e, a trench oxide layer 18 is thickly deposited on all exposed elements of inner walls of the trench 200, the LOCOS oxide layer 15, and the nitride layer 13 until the trench 200 is sufficiently filled. Prior to depositing the trench oxide layer 18, a liner oxide layer 17 may be formed to a thickness of 100–500 Å over all exposed elements of the inner walls of the trench 200, the LOCOS oxide layer 15, and the nitride layer 13. The liner oxide layer 17 improves deposition characteristics of the trench oxide layer 18. Further, prior to depositing the trench oxide layer 18, the liner oxide layer 17 may be formed to a thickness of 100–500 Å after removing the remaining portion of the LOCOS oxide layer 15.

Alternatively, with reference to FIGS. 3d and 3f, the exposed, remaining portions of the LOCOS oxide layers 15 (FIG. 3d) may be removed (FIG. 3f). Next, with reference to FIG. 3g, a liner oxide layer 17 may be formed and a trench oxide layer 18 thickly deposited on all exposed elements of inner walls of the trench 200 and the nitride layer 13 until the trench 200 is sufficiently filled.

Following the above processes, chemical-mechanical polishing is performed on the trench oxide layer 18 to flatten the same, then the nitride layer 13 and the pad oxide layer 12 are removed by a wet etching process. This completes the shallow trench isolation process.

As described above, a LOCOS oxide layer is formed to a small width at predetermined locations corresponding to edge portions of a trench before formation of the same. As a result, upper corners of the silicon wafer adjacent to the trench are formed into a rounded configuration. This allows the device to be made to small sizes, which proved problematic with conventional methods in which corner portions of the silicon wafer adjacent to the trench become sharply pointed with increases in the degree of integration of the device.

Although embodiments of the present invention have been described in detail herein above in connection with certain exemplary embodiments, it should be understood that the invention is not limited to the disclosed exemplary embodiments, but, on the contrary is intended to cover various modifications and/or equivalent arrangements included within the spirit and scope of the present invention, as defined in the appended claims.

What is claimed is:

1. A method of forming a trench in a semiconductor device, comprising:
    forming a sacrificial layer on a silicon wafer and selectively etching the sacrificial layer to form a LOCOS opening having a predetermined width;
    performing thermal oxidation on a portion of the silicon wafer exposed through the LOCOS opening to form a LOCOS oxide layer;
    etching the LOCOS oxide layer and the silicon wafer to a desired depth to form a trench, the etching being performed such that the LOCOS oxide layer is left remaining on the silicon wafer at an area corresponding to edges of the trench;
    removing the remaining region of the LOCOS oxide layer and forming a liner oxide layer in the trench; and
    forming an insulation layer such that the trench is filled with a material of the insulation layer.

2. The method of claim 1, wherein during formation of the LOCOS opening, one of a predetermined width of the sacrificial layer located at edges of a region where a trench is to be formed and the sacrificial layer is etched to a width greater by a predetermined amount than a region to be occupied by the trench.

3. The method of claim 2, wherein in etching a predetermined width of the sacrificial layer located at edges of a region where a trench is to be formed, the sacrificial layer is etched to a width of 50–500 Å.

4. The method of claim 2, wherein in etching the sacrificial layer to a width greater by a predetermined amount than a region to be occupied by a trench, the sacrificial layer is etched having a width that is at most 400 Å greater than the trench.

5. The method of claim 4, wherein the sacrificial layer comprises a nitride layer.

6. The method of claim 1, wherein during formation of the trench, a photoresist layer is deposited on the LOCOS oxide layer and the sacrificial layer, then the photoresist layer is exposed and developed to form a photoresist layer pattern that exposes an area of the LOCOS oxide layer where a trench is to be formed, after which the photoresist layer pattern is used as a mask to etch the exposed area of the LOCOS oxide layer and the silicon wafer to a desired depth.

7. The method of claim 6, wherein the photoresist layer pattern is formed so that at most 200 Å of a width of the LOCOS oxide layer positioned at edges of the trench is covered such that at most 400 Å of an entire cross-sectional width is covered, and the remainder of the LOCOS layer is exposed.

8. The method of claim 1, the liner oxide layer covering inner walls of the trench and the sacrificial layer.

9. The method of claim 8, wherein the liner oxide layer is formed to a thickness of 100–500 Å.

10. The method of claim 1, wherein the liner oxide layer is formed to a thickness of 100–500 Å.

11. The method of claim 1, further comprising performing chemical-mechanical polishing on the insulation layer following the formation of the same until the sacrificial layer is exposed.

12. The method of claim 1, further comprising forming a pad oxide layer on the silicon wafer prior to forming the sacrificial layer, and forming the sacrificial layer on the pad oxide layer.

13. The method of claim 1, wherein the sacrificial layer comprises a material that is polished more slowly than the insulation layer that fills the trench.

14. The method of claim 1, the sacrificial layer comprises a nitride layer.

15. The method of claim 14, wherein the nitride layer is formed to a thickness of 1500–3000 Å.

* * * * *